(12) United States Patent
Denis et al.

(10) Patent No.: US 6,657,505 B2
(45) Date of Patent: Dec. 2, 2003

(54) DIELECTRIC RESONATOR OSCILLATOR AND VOICE CONTROL DEVICE

(75) Inventors: Bernard Denis, Saint Senoux (FR); Jean-Yves Le Naour, Pacé (FR); Jean-Luc Robert, Betton (FR)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 10/168,203

(22) PCT Filed: Dec. 20, 2000

(86) PCT No.: PCT/FR00/03615
§ 371 (c)(1),
(2), (4) Date: Jun. 19, 2002

(87) PCT Pub. No.: WO01/50591
PCT Pub. Date: Jul. 12, 2001

(65) Prior Publication Data
US 2002/0190804 A1 Dec. 19, 2002

(30) Foreign Application Priority Data
Dec. 31, 1999 (FR) ............................................. 99 16866

(51) Int. Cl.⁷ .............................................. H03B 11/10
(52) U.S. Cl. .................................. 331/107 DP; 331/155
(58) Field of Search ................... 331/107 DP, 154–156

(56) References Cited

U.S. PATENT DOCUMENTS 3,649,932 A * 3/1972 Copeland ....................... 332/2

FOREIGN PATENT DOCUMENTS

JP      58-054706      3/1983

* cited by examiner

*Primary Examiner*—Kenneth B. Wells
(74) *Attorney, Agent, or Firm*—Joseph S. Tripoli; Joseph J. Laks; Reitseng Lin

(57) ABSTRACT

The invention relates to a dielectric resonator oscillator, comprising a dielectric resonator contained in a resonant cavity in order to generate a signal oscillating at a predetermined central frequency, the dimensions of the resonator and the limiting conditions in the cavity being capable of determining the resonant frequency of the resonator. It comprises means sensitive to acoustic pressure waves capable of modifying the distribution of the electromagnetic fields in the cavity as a function of said acoustic pressure waves. The invention also relates to a voice control device equipped with an oscillator according to the invention. Particular application to remote voice control devices for controlling domestic equipment.

14 Claims, 3 Drawing Sheets

DIELECTRIC RESONATOR OSCILLATOR AND VOICE CONTROL DEVICE

This application claims the benefit, under 35 U.S.C. §365 of International Application PCT/FR00/03615, filed Dec. 20, 2000, which was published in accordance with PCT Article 21(2) on Jul. 12, 2001 in French and which claims the benefit of French patent application No. 9916866 filed Dec. 31, 1999.

The invention relates to the field of signal transmissions, especially within the super-high frequency (SHF) range. More particularly, the invention relates to a dielectric resonator oscillator for transposing audio signals into the SHF frequency range. The invention also relates to a voice control device.

SHF dielectric resonator oscillators (DROs) are commonly used in devices for transmitting SHF signals, enabling high-performance oscillators of small size and of low cost to be obtained. They are especially used as a local oscillator for frequency transposition in low-noise converters for satellite reception.

Figure 1:
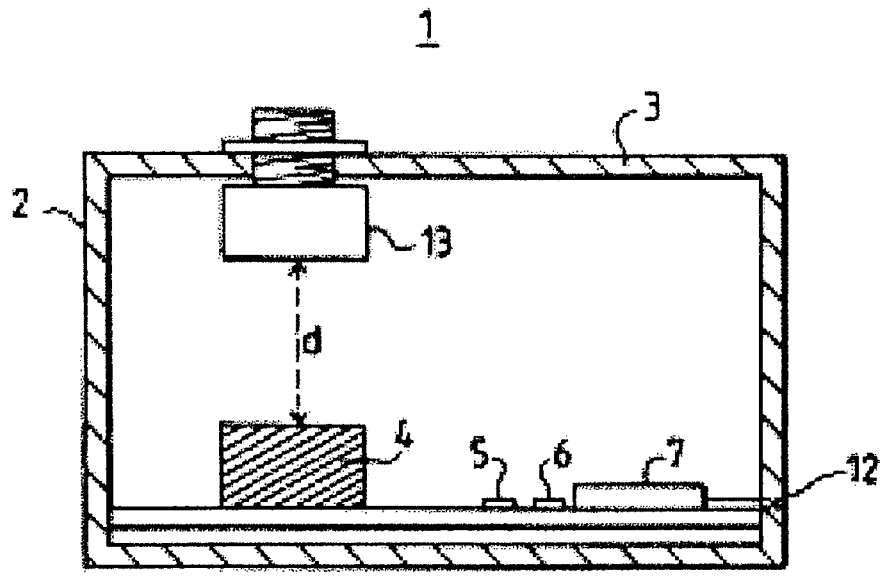
Figure 2:
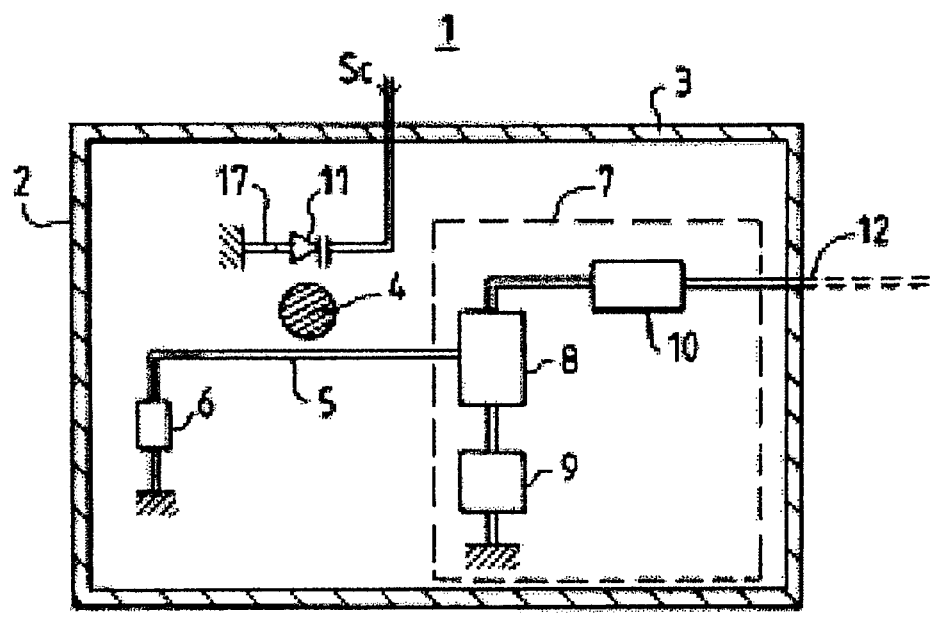

FIG. 1 shows schematically a dielectric resonator oscillator 1 with a tuning screw, of the prior art. The latter comprises an electromagnetic cavity 2 delimiting by its walls 3 a dielectric resonator 4 coupled to a first microstrip line 5. A circuit 7, illustrated in FIG. 2 showing another resonator of the prior art, the rest of which will be described below, is common to the two resonators and fulfills the same functions. Consequently, the description of the main components of this circuit 7 will be made with reference to FIG. 2. In general, in order to simplify the description, the same references will be used to denote the elements fulfilling identical functions in the present application. The coupling line 5 is, on the one hand, connected to the active circuit 7 and, on the other hand, to an impedance matching load 6. The active circuit 7 comprises an active element 8, of the bipolar transistor or FET type, an element 9 destabilizing the active part, for example of the LC circuit type, and an output impedance matching element 10, of the microstrip line type. It is known that the RLC circuit equivalent to the resonator is the source of damped oscillations, the damping of these oscillations being due to the resistive part of the RLC circuit. This active circuit with a negative resistance then has the function of providing the energy needed to maintain the oscillations, so that the signal delivered to an output 12 of the oscillator is an undamped oscillating signal. It is also known to a person skilled in the art that the assembly formed by the resonator coupled by the microstrip line to the active circuit must exhibit oscillation conditions favorable to the oscillation frequency sought. In the oscillator of FIG. 1, a screw 13 enters the wall 3 of the cavity opposite the dielectric resonator 4. Its degree of penetration in a direction perpendicular to the surface opposite the resonator generates a disturbance in the distribution of the electromagnetic fields in the cavity and, subsequently, a modification of the resonant frequency of the equivalent resonant circuit. Thus, varying the distance d between the end part of the screw entering the cavity and the upper surface of the resonator involves modifying of the frequency of the signal generated by the oscillator. However, this type of oscillator, involving manual adjustment of the distance d, does not allow the fine variations around a central frequency to be faithfully complied with, and without distortion; it is therefore not suitable for transmitting audio signals.

In order to overcome problems linked to the mechanical adjustments as mentioned above, oscillators called electronic oscillators are also known, as illustrated in FIG. 2 showing a dielectric resonator oscillator with a varactor. A varactor 11, connected to a second microstrip line 17 coupled to the dielectric resonator, receives a control signal $S_c$ of variable voltage indicating an audio signal to be transmitted. The resonator-varactor assembly behaves like a resonant circuit setting the oscillation frequency of the oscillator. Thus, the variation in the voltage delivered by the signal $S_c$ modifies the oscillation frequency of the oscillating circuit 7. However, the use of a varactor has the effect of degrading the phase noise of the oscillator and consequently of degrading the quality of the signal generated at the output of the oscillator.

The object of the invention is to overcome the problems of the prior art by providing a dielectric resonator oscillator for transposing audio signals.

To this end, the invention is a dielectric resonator oscillator, comprising a dielectric resonator contained in a resonant cavity in order to generate a signal oscillating at a predetermined central frequency, the dimensions of the resonator and the limiting conditions in the cavity being capable of determining the resonant frequency of the resonator. A means sensitive to acoustic pressure waves is capable of modifying the distribution of the electromagnetic fields in the cavity as a function of said acoustic pressure waves. The means sensitive to acoustic waves comprise a membrane which is movable under the effect of acoustic waves, said membrane engaging a metal coil in the cavity.

Thus, the means sensitive to acoustic pressure waves directly change in time with the acoustic pressure exerted at one of the inputs of said sensitive means. In this way, the invention makes it possible to generate a signal modulated directly by the audio signal at this input.

According to one embodiment, said means sensitive to acoustic pressure waves comprise acoustic transducer means for converting the acoustic pressure waves into a displacement of at least part of detachable means facing the resonator, the displacement of at least part of these detachable means under the effect of acoustic pressure waves being capable of modifying the distribution of the electromagnetic fields in the cavity.

According to one embodiment, the displacement of said detachable means is carried out in the form of vibrations.

According to one embodiment, the means sensitive to acoustic waves comprise a membrane which is movable under the effect of acoustic waves and can engage a metal coil in the cavity.

According to one embodiment, the oscillator comprises adjustment means to adjust the central frequency of the resonator.

According to one embodiment, said adjustment means comprise an adjustment screw which can be engaged in the cavity in order to modify the distribution of the electromagnetic fields therein.

According to one embodiment, the oscillator comprises switching means to switch the modulation by acoustic waves of the signal generated by the resonator to modulation by data transmitted over a channel.

According to one embodiment, an active dipole is coupled to said resonator by coupling means in order to maintain the oscillations.

The subject of the invention is also a voice control device, characterized in that it comprises an oscillator according to the invention.

Figure 3:
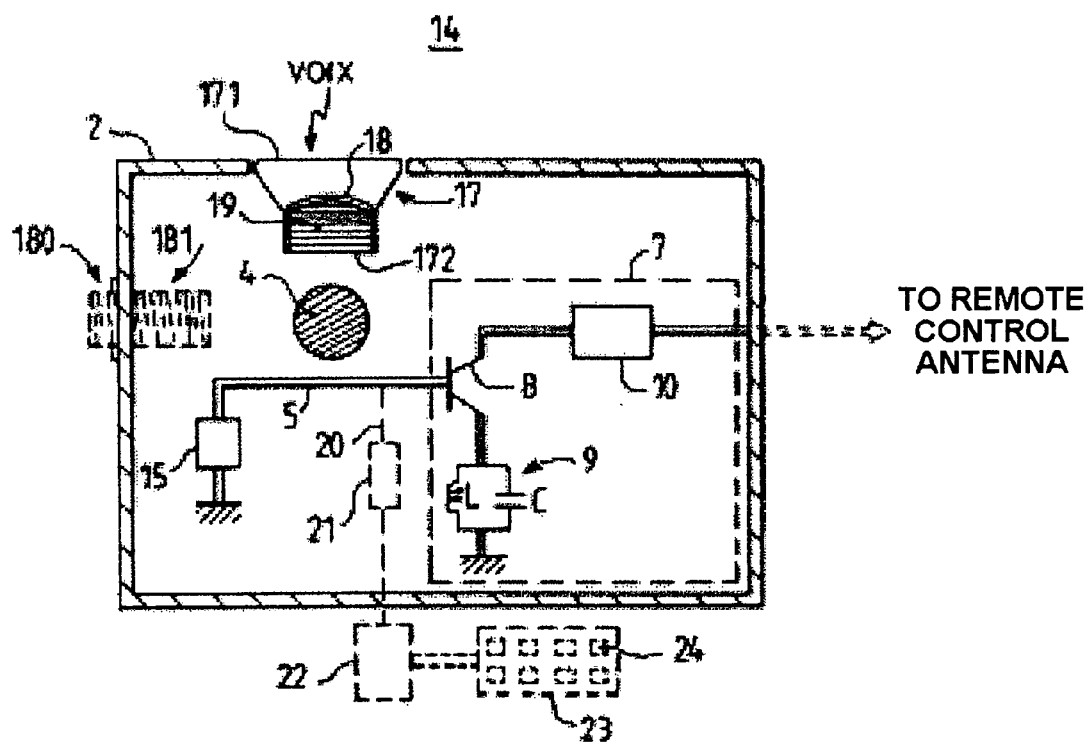
Figure 4:
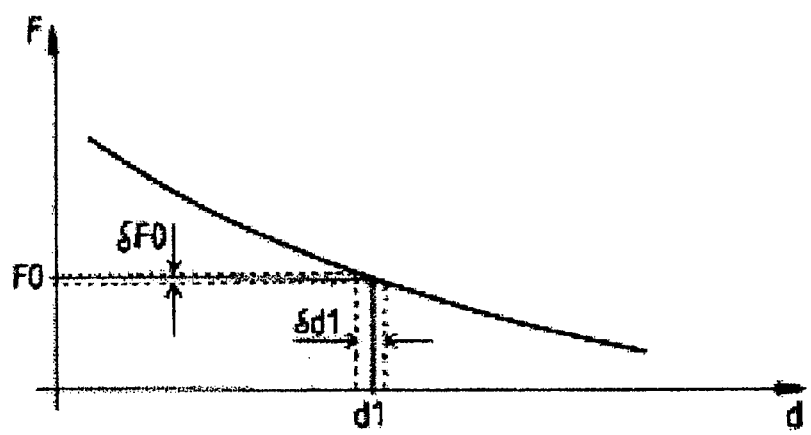
Figure 5:
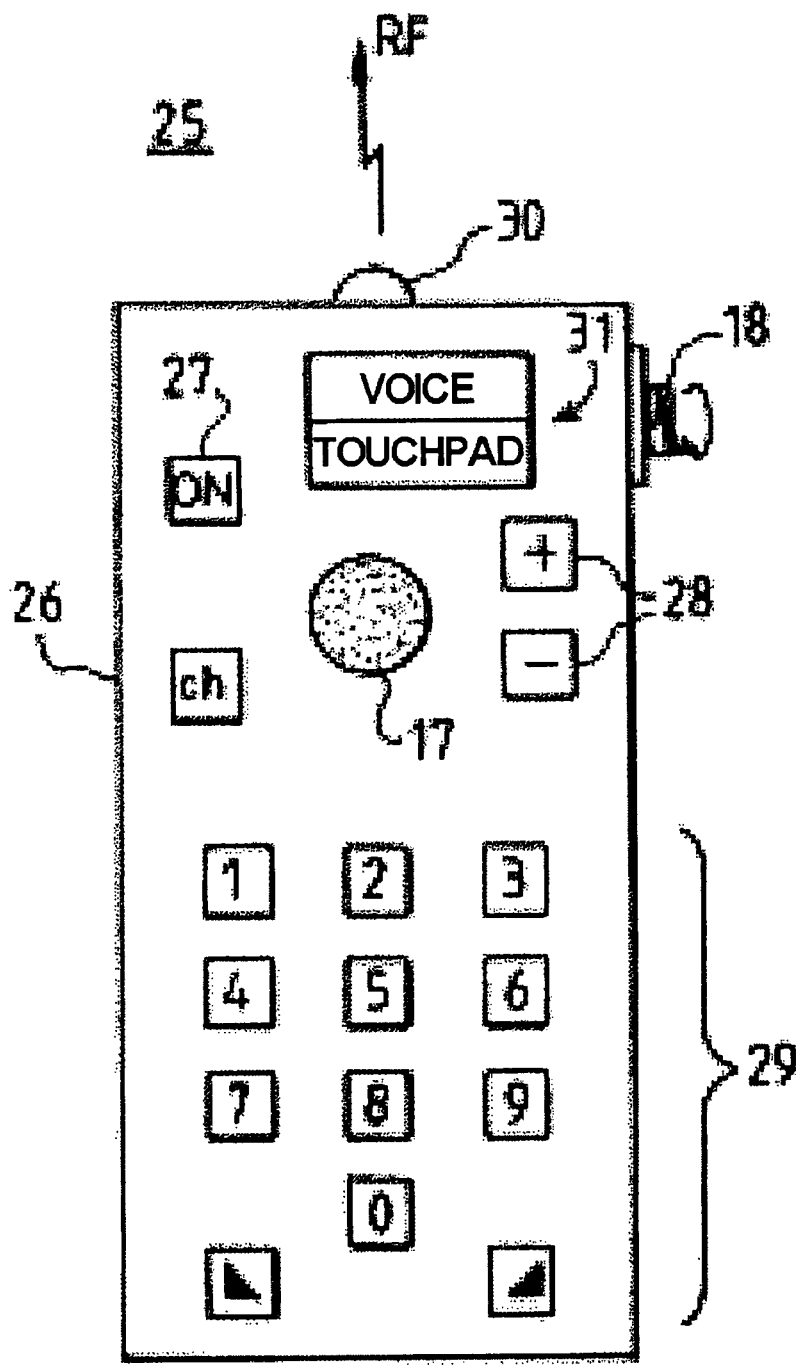

Other characteristics and advantages of the present invention will become apparent from the following description of exemplary embodiments, taken by way of nonlimiting examples, with reference to the appended figures in which:

FIGS. 1 and 2, already described, show two dielectric resonator oscillators of the prior art, FIG. 3 shows a dielectric resonator oscillator according to one embodiment of the invention, FIG. 4 illustrates a curve showing the variation in frequency, to which the signal output from the oscillator of FIG. 3 is subject, as a function of the distance d, FIG. 5 shows a remote control device according to the invention.

FIG. 3 illustrates an oscillator 14 according to the invention. It comprises a resonant cavity 2 inside which there is a resonator 4 electromagnetically coupled to a microstrip line 5. The line 5 connects a load 15 to an active circuit 7. The active circuit comprises, at its input connected to the line 5, a transistor of the FET type, whose source is connected to a circuit, for example of the LC type connected to ground, whose role is to make the transistor stage unstable, and whose drain is connected is to a network 10 for matching the output impedance of the oscillator.

The cavity comprises an opening 16 in which the body of a microphone 17 is engaged. The upper part 171 of the microphone 17 is oriented toward free space and can receive acoustic pressure waves, in particular orders in voice form from a user while the lower part 172 of the microphone is itself facing the upper part of the resonator. The base of the upper part 171 receiving the voice of the user narrows down to a membrane 18 in contact with a metal coil 19. The latter is capable of moving in the direction perpendicular to the resonator under the effect of the vibration of the membrane receiving acoustic waves.

Thus, the mechanical vibration of the membrane with its coil enables the acoustic pressure exerted by the user to be measured, translating his voice. The mechanical modulation of this membrane with its coil modifies the properties of the cavity, the consequence of which is the modulation of the instantaneous frequency of the SHF signal created by the resonator (for example at 5.8 GHz) in synchronism with the voice signal to be transmitted. One advantage of the invention arises from the simplicity of the microphone used in the present embodiment, which is lacking its magnet.

For further information, reference may be made to chapter II relating to the use of dielectric resonators, page 30 et seq. of the work, "Composants, dispositifs et circuits actifs en micro-ondes" [Microwave active circuits, devices and components] by P. F. Combes, J. Graffeuil and J. F. Sautereau, Dunod University Publishing, and the article "Current techniques for tuning dielectric resonators" by B. S. Virdee, in the journal "Microwave Journal", October 1998.

As shown in FIG. 4, since the resonator is centered on a central frequency $F_0$, a modification of the distance d equivalent to $\delta d1$ leads to a change in frequency $\delta F_0$ of about 5%, which is unimportant to the oscillator performance. This small variation $\delta F_0$ can be considered as linear or almost linear depending on the displacement $\delta d1$ of the coil in the cavity, which provides a direct modulation by the audio signal of the signal generated by the resonator, without distortion thereof.

According to an additional characteristic of the invention, a mechanical tuning screw 180, which can be adjusted from outside the cavity 2 and whose part 181 engaged in the cavity is laterally opposite the resonator and is positioned so as to be able to adjust the central frequency of the oscillator as necessary, is shown in FIG. 3 in dotted lines. Also illustrated in FIG. 3 in dotted lines, according to an additional feature, is a connection 20 connecting, via a resistor 21, the microstrip line 5 to a microprocessor 22 generating a significant digital signal for the selection by the user of a command 24 from a command table 23. According to the latter embodiment, the signal generated by the resonator is either modulated by the displacement of the coil 19 generated by the acoustic waves received at the membrane, or by the data transmitted by the microprocessor in the form of pulses. This option of choosing the modulating signal is enabled by the use of a switch (not shown in FIG. 3), which allows transmission of the voice or of the data. One application of this mode is shown in FIG. 5, illustrating a remote control device for controlling any controllable appliance, especially a domestic appliance (television set, video recorder, camcorder, disk or digital cassette reader/recorder, etc.).

The remote control device 25 illustrated in FIG. 5 comprises, in a conventional manner, a keyboard 26 having buttons 24 including a standby button 27 and a volume increase and decrease button 28, a digital pad 29 in particular allowing a channel to be chosen, and a high-frequency (HF) signal emitter 30. The remote control device further comprises a microphone 17 and a switch 31 for selecting the communication mode that the user wishes to establish, namely a voice mode corresponding to a "voice" button in which the signal generated by the resonator is modulated by the voice of the user, and a touchpad selection mode corresponding to the "touchpad" button in which the signal generated by the resonator is modulated by the signal generated by the microprocessor which depends on the buttons actuated.

Of course, the invention is not limited to the embodiments described in the present application. There are various sorts of voice commands. In a nonlimiting manner, mention will first of all be made of tuning into a channel. In this case, the user pronounces the name allocated to the channel or the corresponding number.

The voice command may also be used to simplify operations which require successive actions when they are controlled by touchpad. For example, in order to control the brightness using the remote control keyboard, it is necessary first to access a menu displayed on the screen of the receiver and next, to select from this menu, by means of one or more operations, the brightness command. With the voice command, it is not necessary to carry out successive operations. It is enough to pronounce, for example, the word "brightness". In this case, the brightness can be increased or decreased either by a voice command, or using the conventional increase and decrease buttons ("plus" and "minus") on the remote control box.

Of course, the application is not limited to the voice-activated remote controls but can be envisioned for voice commands of another type (wire for example) or else a microphone.

What is claimed is:

1. A dielectric resonator oscillator, comprising:
   a dielectric resonator contained in a resonant cavity in order to generate a signal oscillating at a predetermined central frequency, the dimensions of the resonator and the limiting conditions in the cavity being capable of determining the resonant frequency of the resonator
   means sensitive to acoustic pressure waves capable of modifying the distribution of the electromagnetic fields in the cavity as a function of said acoustic pressure waves
   wherein said means sensitive to acoustic waves comprise a membrane which is movable under the effect of acoustic waves and can engage a metal coil in the cavity.

2. The oscillator as claimed in claim 1, wherein said means sensitive to acoustic pressure waves comprise acoustic transducer means to convert the acoustic pressure waves into a displacement of at least part of detachable means facing the resonator, the displacement of at least part of these detachable means under the effect of acoustic pressure waves being capable of modifying the distribution of the electromagnetic fields in the cavity.

3. The oscillator as claimed in claim 2, wherein the displacement of said detachable means is carried out in the form of vibrations.

4. The oscillator as claimed in claim 1, wherein said oscillator comprises adjustment means to adjust the central frequency of the resonator.

5. The oscillator as claimed in claim 4, wherein said adjustment means comprise an adjustment screw which can be engaged in the cavity in order to modify the distribution of the electromagnetic fields therein.

6. The oscillator as claimed in claim 1, wherein said oscillator comprises switching means to switch the modulation by acoustic waves of the signal generated by the resonator to modulation by data transmitted over a channel.

7. The oscillator as claimed in claim 1, wherein an active dipole is coupled to said resonator by coupling means in order to maintain the oscillations.

8. A voice control device, including an oscillator, said oscillator comprising:
   a dielectric resonator contained in a resonant cavity in order to generate a signal oscillating at a predetermined central frequency, the dimensions of the resonator and the limiting conditions in the cavity being capable of determining the resonant frequency of the resonator,
   a means sensitive to acoustic pressure waves capable of modifying the distribution of the electromagnetic fields in the cavity as a function of said acoustic pressure waves
   wherein said means sensitive to acoustic waves comprise a membrane which is movable under the effect of acoustic waves and can engage a metal coil in the cavity.

9. The oscillator as claimed in claim 8, wherein said means sensitive to acoustic pressure waves comprise acoustic transducer means to convert the acoustic pressure waves into a displacement of at least part of detachable means facing the resonator, the displacement of at least part of these detachable means under the effect of acoustic pressure waves being capable of modifying the distribution of the electromagnetic fields in the cavity.

10. The oscillator as claimed in claim 9, wherein the displacement of said detachable means is carried out in the form of vibrations.

11. The oscillator as claimed in claim 8, wherein said oscillator comprises adjustment means to adjust the central frequency of the resonator.

12. The oscillator as claimed in claim 11, wherein said adjustment means comprise an adjustment screw which can be engaged in the cavity in order to modify the distribution of the electromagnetic fields therein.

13. The oscillator as claimed in claim 8, wherein said oscillator comprises switching means to switch the modulation by acoustic waves of the signal generated by the resonator to modulation by data transmitted over a channel.

14. The oscillator as claimed in claim 8, wherein an active dipole is coupled to said resonator by coupling means in order to maintain the oscillations.

* * * * *